(12) United States Patent
Chu et al.

(10) Patent No.: US 12,713,567 B2
(45) Date of Patent: Aug. 18, 2026

(54) THERMAL EXCHANGE DEVICE AND POWER SUPPLY SYSTEM APPLYING THE SAME

(71) Applicant: LITE-ON TECHNOLOGY CORPORATION, Taipei (TW)

(72) Inventors: Shu-Wei Chu, Taipei (TW); Chien-Chih Lee, Taipei (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 258 days.

(21) Appl. No.: 18/638,709

(22) Filed: Apr. 18, 2024

(65) Prior Publication Data

US 2025/0081412 A1 Mar. 6, 2025

Related U.S. Application Data

(60) Provisional application No. 63/534,873, filed on Aug. 28, 2023.

(30) Foreign Application Priority Data

Mar. 7, 2024 (TW) ................................ 113108334

(51) Int. Cl.
*H05K 7/20* (2006.01)

(52) U.S. Cl.
CPC .................................... *H05K 7/209* (2013.01)

(58) Field of Classification Search
CPC .. G02B 6/4269; G02B 6/4201; G02B 6/4261; G02B 6/4284; G02B 6/3814; G02B 6/3897; G02B 6/4245; G02B 6/4256; G02B 6/4266; H05K 7/2049; H05K 7/20409; H05K 7/20509; H05K 7/209; H05K 1/0203; H05K 2201/10416; H05K 5/0286; H05K 7/1402; H05K 7/1489; H05K 7/20154; H05K 7/20418; H05K 7/20436; H05K 7/20445; H05K 7/205; H05K 7/20909; H05K 5/0295; F28F 2275/08
See application file for complete search history.

(56) References Cited

U.S. PATENT DOCUMENTS 6,556,446 B1 * 4/2003 Hwang ................ G02B 6/4201 361/740
7,667,972 B2 * 2/2010 Chen .................... H05K 7/2049 165/185

(Continued)

*Primary Examiner* — Michael A Matey
(74) *Attorney, Agent, or Firm* — WPAT, PC

(57) ABSTRACT

A thermal exchange device including a sliding plate and a thermal exchange unit is provided. The sliding plate includes a plate-shaped body, a first flange and a second flange. The first flange, protruding from a first side of the plate-shaped body, has a guide slit including a first section, a second section and a guide slit connecting the two sections. The first section, extending in a direction parallel to a long axis of the plate-shaped body, is separated from the first side by a first distance. The second section, extending to the said direction, is separated from the first side by a second distance greater than the first distance. The second flange, protruding from a second side of the plate-shaped body, defines a slide groove with the first flange and the plate-shaped body. The thermal exchange unit, at least partly received in the slide groove, includes a guide rod.

10 Claims, 6 Drawing Sheets

(56) References Cited

U.S. PATENT DOCUMENTS 7,733,652 B2 * 6/2010 Costello ............... H05K 5/0286
361/704
9,453,972 B1 * 9/2016 Arvelo ................. G02B 6/3825
10,212,852 B1 * 2/2019 Reddy ..................... F28F 3/022
10,222,844 B1 * 3/2019 Reddy ....................... G06F 1/20
10,925,186 B2 * 2/2021 Selvidge ............ H05K 7/20509
12,294,175 B2 * 5/2025 Wu ...................... G02B 6/4277
2004/0101257 A1 * 5/2004 Kruger ................. G02B 6/3897
385/92
2009/0296350 A1 * 12/2009 Oki ...................... G02B 6/4269
361/709
2020/0291996 A1 * 9/2020 Harvey ................ A47B 88/493
2023/0034486 A1 * 2/2023 Scott .................. H05K 7/20709
2024/0012456 A1 * 1/2024 Li ........................... G06F 1/203

* cited by examiner

THERMAL EXCHANGE DEVICE AND POWER SUPPLY SYSTEM APPLYING THE SAME

This application claims the benefit of U.S. provisional application Ser. No. 63/534,873, filed Aug. 28, 2023 and Taiwan application Serial No. 113108334, filed Mar. 7, 2024, and the subject matter of which is incorporated herein by reference.

BACKGROUND OF THE INVENTION

Field of the Invention

The invention relates in general to a thermal exchange device and a power supply system applying the same, and more particularly to a thermal exchange device used in an electronic device and a power supply system applying the same.

Description of the Related Art

Along with the increase in the computing efficiency of an electronic device or information equipment, the power consumption of the electronic device or information equipment also increases, and the accumulation of waste heat becomes even more severe. To assure the smooth operation of the electronic device or information equipment, the prior art normally has a thermal exchange device arranged in the element or module (referred as thermal source body here below) of the information equipment with severe accumulation of waste heat. The waste heat generated by the thermal source body is transferred to the casing through the thermal exchange device to avoid too much waste heat accumulating in the electronic device or information equipment and causing hot crash.

Nowadays, most of the existing thermal exchange devices adopt wind-cooling technology, which uses air as a thermal convection medium and provides a larger area of thermal exchange through the use of heat dissipation fins. Nonetheless, heat dissipation fins, which require a larger structural volume and are subjected to some specific setting conditions (for instance, air circulation), are disadvantageous to the configuration of the thermal exchange device and may easily jeopardize the miniaturization of the electronic device or information equipment.

Furthermore, as the demand for the computing power of the electronic device or information equipment increases without a limit and the power consumption of the chips of an inbuilt server also escalates, the liquid cooling system is more efficient than the air-cooling system and has gradually become a mainstream solution to the heat dissipation of high-performance servers. In the liquid cooling system, the cold plate of the inbuilt circulation channel contacts the thermal source body (such as the power supply unit), then guides the heat to the casing when the fluid flows in the circulation channel.

However, it has become a prominent task for the industries to provide a thermal exchange device, which makes it easier to arrange the cold plate and the components of the thermal source body in the electronic device or information equipment, increases the heat dissipation effect of the cold plate and makes the assembly, plugging/unplugging and replacement of the thermal source body easier, so that the maintenance and repair of the electronic device or information equipment become more convenient and the structural miniaturization of the electronic device or information equipment can be well attended.

Therefore, there is a need to provide an advanced thermal exchange device and a power supply system applying the same to resolve the problems encountered in the prior art.

SUMMARY OF THE INVENTION

A thermal exchange device is disclosed in an embodiment of the present specification. The thermal exchange device includes a sliding plate and a thermal exchange unit. The sliding plate includes a plate-shaped body, a first flange and a second flange. The plate-shaped body has a long axis. The first flange protrudes from a first side of the plate-shaped body; the first side is parallel to the long axis. The first flange has a first guide slit including a first section, a second section and a first guide slit connecting the first section and the second section. The first section extends in a direction parallel to the long axis and is separated from the first side by a first distance. The second section extends in a direction parallel to said direction and is separated from the first side by a second distance greater than the first distance. The second flange, protruding from a second side of the plate-shaped body and parallel to the first flange, defines a slide groove with the first flange and the plate-shaped body. The thermal exchange unit is at least partly received in the slide groove and includes a first guide rod extending into the first guide slit to limit the movement of the sliding plate relative to the thermal exchange unit in a direction parallel and/or perpendicular to said direction.

A power supply system is disclosed in an embodiment of the present specification. The power supply system includes a sliding plate, a thermal exchange unit, a power supply unit and a bracket. The sliding plate includes a plate-shaped body, a first flange and a second flange. The plate-shaped body has a long axis. The first flange protrudes from a first side of the plate-shaped body; the first side is parallel to the long axis. The first flange has a first guide slit including a first section, a second section and a first guide slit connecting the first section and the second section. The first section extends in a direction parallel to the long axis and is separated from the first side by a first distance. The second section extends in a direction parallel to the said direction and is separated from the first side by a second distance greater than the first distance. The second flange, protruding from a second side of the plate-shaped body and parallel to the first flange, defines a slide groove with the first flange and the plate-shaped body. The thermal exchange unit is at least partly received in the slide groove and includes a first guide rod, extending into the first guide slit to limit the movement of the sliding plate in the slide groove. The bracket includes a first accommodation space and a second accommodation space. The first accommodation space allows the power supply unit to be detachably received therein. The second accommodation space and the first accommodation space are interconnected to allow the thermal exchange unit and a part of the sliding plate to be detachably received therein and allow the sliding plate to move relative to the thermal exchange unit in a direction parallel and/or perpendicular to the said direction, so that the thermal exchange unit can contact the power supply unit contact or move farther away from the power supply unit.

According to the above embodiments, a thermal exchange device and a power supply system applying the same are provided. The thermal exchange device includes a thermal exchange unit and a sliding plate arranged on the thermal exchange unit. The thermal exchange unit and the sliding plate can be slidably coupled together through the guide member protruding from of the thermal exchange unit and the guide slit arranged in the sliding plate. Then, the sliding plate can be slidably fixed on the inner side of the upper cover of the bracket. The guide slits parallel to the long axis of the sliding plate can guide the sliding plate to horizontally move relative to the thermal exchange unit in a direction parallel to the long axis. Through the design of differential vertical distance between different sections of the guide slit and the plate-shaped body of the sliding plate, the guide member is dragged, so that the thermal exchange unit vertically can move in a direction perpendicular to the long axis of the sliding plate to adjust the distance between the thermal exchange unit and the inner side of the upper cover of the bracket.

When the thermal exchange device and the thermal source body are both received in the accommodation cavity of the power supply system, the horizontal/vertical movement of the sliding plate enables the thermal exchange unit to tightly contact the thermal source body, so that the efficiency of heat dissipation can be increased. Or, the thermal exchange unit and the thermal source body are separated from each other, so that the thermal source body can be more easily detached or assembled in the accommodation cavity through simple plugging/unplugging actions.

The above and other aspects of the invention will become better understood with regard to the following detailed description of the preferred but non-limiting embodiment(s). The following description is made with reference to the accompanying drawings.

DETAILED DESCRIPTION OF THE INVENTION

The present specification provides a thermal exchange device and a power supply system applying the same capable of increasing the efficiency of heat dissipation and/or making the assembly, plugging/unplugging, and replacement the thermal source body more easily. For the object, technical features and advantages of the present invention to be more easily understood by anyone ordinary skilled in the technology field, a number of exemplary embodiments are disclosed below with detailed descriptions and accompanying drawings.

It should be noted that these embodiments are for exemplary and explanatory purposes only, not for limiting the scope of protection of the invention. The invention can be implemented by using other features, elements, methods and parameters. The preferred embodiments are merely for illustrating the technical features of the invention, not for limiting the scope of protection. Anyone skilled in the technology field of the invention will be able to make suitable modifications or changes based on the specification disclosed below without breaching the spirit of the invention. Designations common to the accompanying drawings are used to indicate identical or similar elements.

Figure 1A:
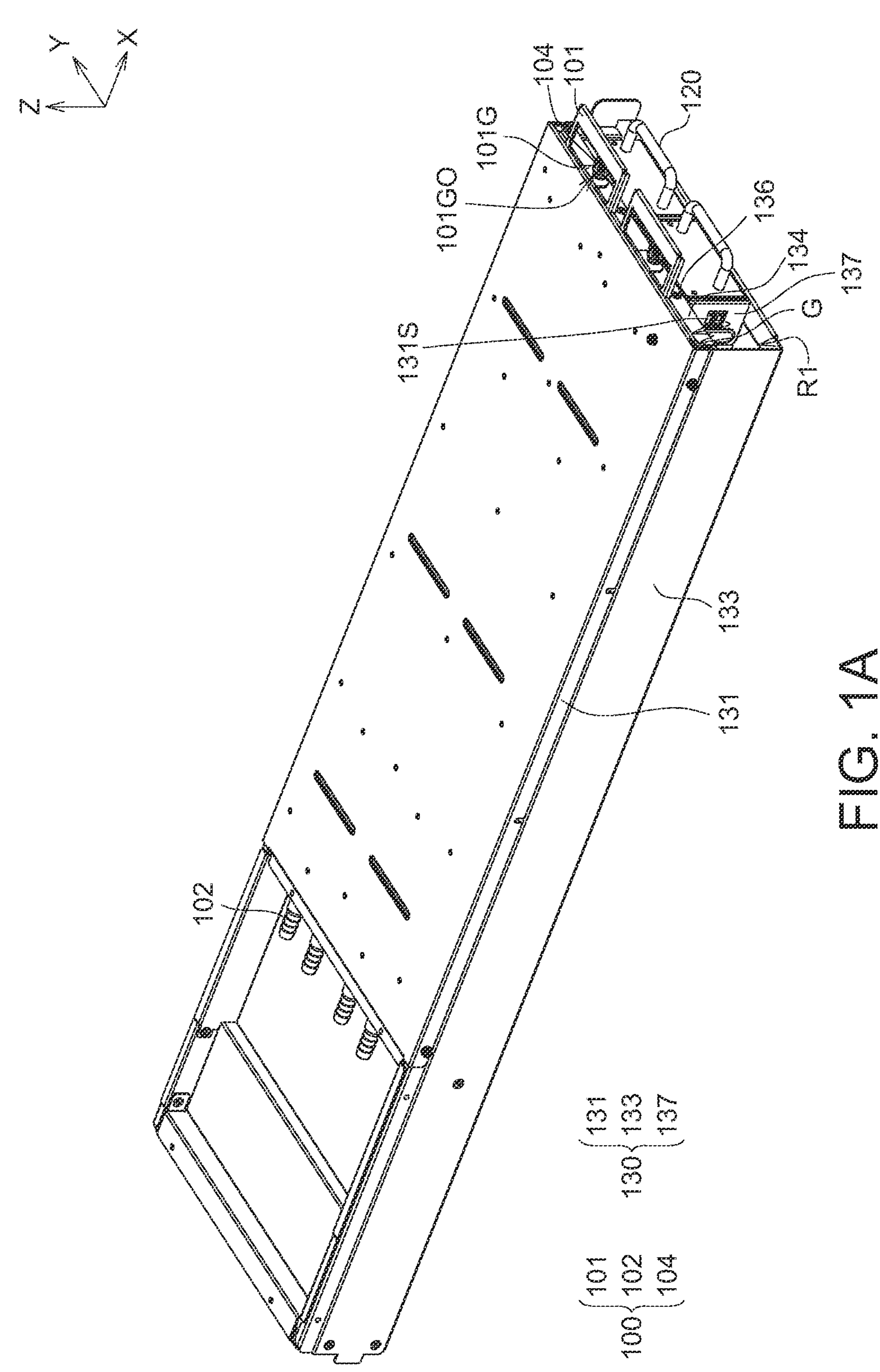
FIG. 1A is a structural perspective diagram of the assembly of a power supply system containing a thermal exchange device according to an embodiment of the present specification.
Figure 1B:
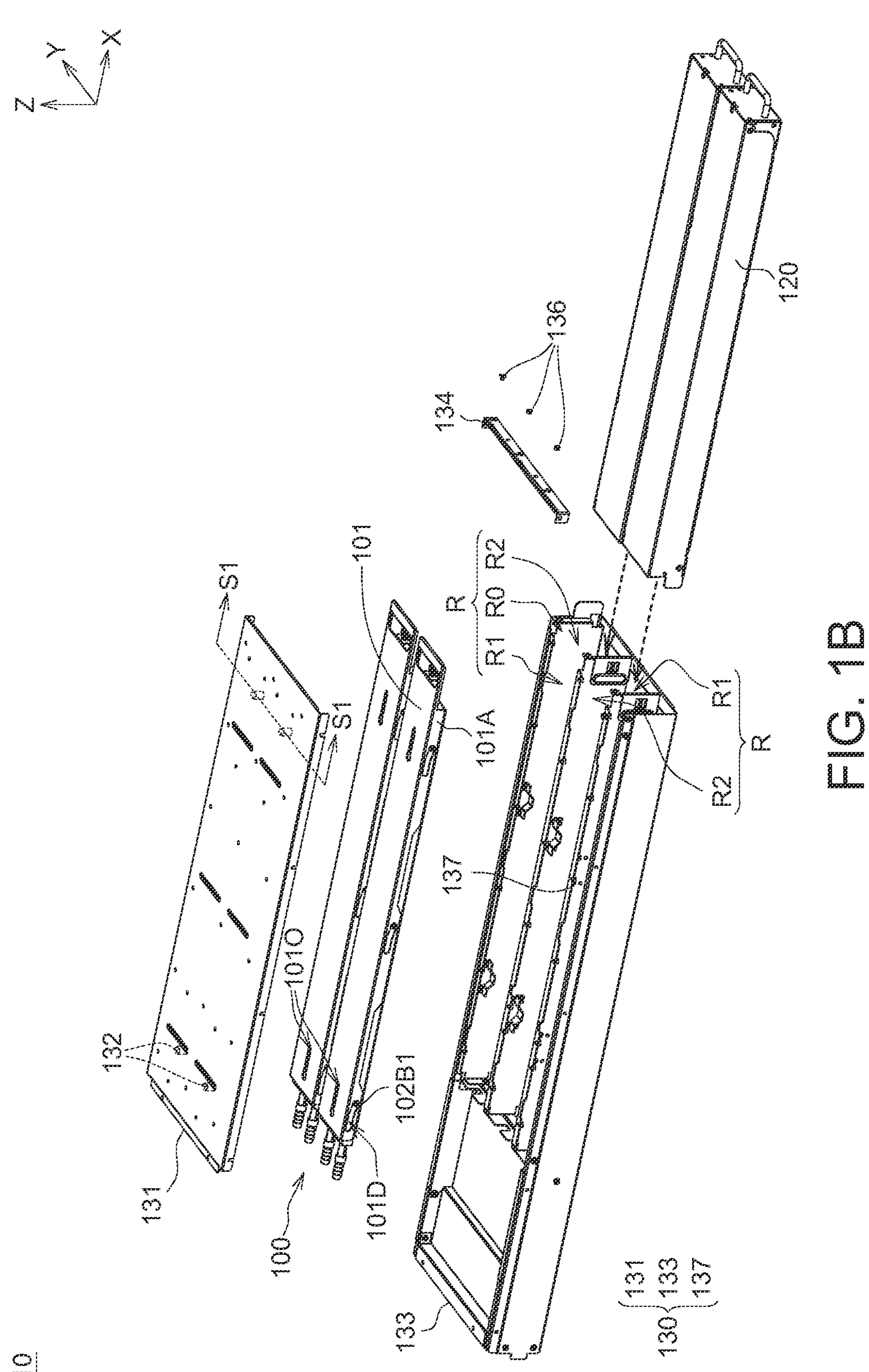
FIG. 1B is a structural explosion diagram of the power supply system of FIG. 1A.

Refer to FIG. 1A and FIG. 1B. FIG. 1A is a structural perspective diagram of the assembly of a power supply system 10 containing a thermal exchange device 100 according to an embodiment of the present specification. FIG. 1B is a structural explosion diagram of the power supply system 100 of FIG. 1A. In the present embodiment, the power supply system 10 includes: a thermal exchange device 100, a power supply unit 120 and a bracket 130.

The bracket 130 includes an upper cover 131 and a plurality of cavities R defined by a plurality of side plates 137 and a bottom casing 133. Each cavity R includes a first accommodation space R1 and a second accommodation space R2 interconnected with the first accommodation space. The first accommodation space R1 is located under the second accommodation space R; the upper cover 131 has an inner surface 131S for defining a top of the first accommodation space R1. The first accommodation space R1 allows the power supply unit 120 to be received therein through plugging and unplugging. The second accommodation space R2 is interconnected with the first accommodation space R1 and allows the thermal exchange device 100 to be detachably received therein.

Figure 2A:
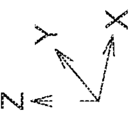
FIG. 2A is a structural perspective diagram of the assembly of a thermal exchange device according to an embodiment of the present specification.
Figure 2A:
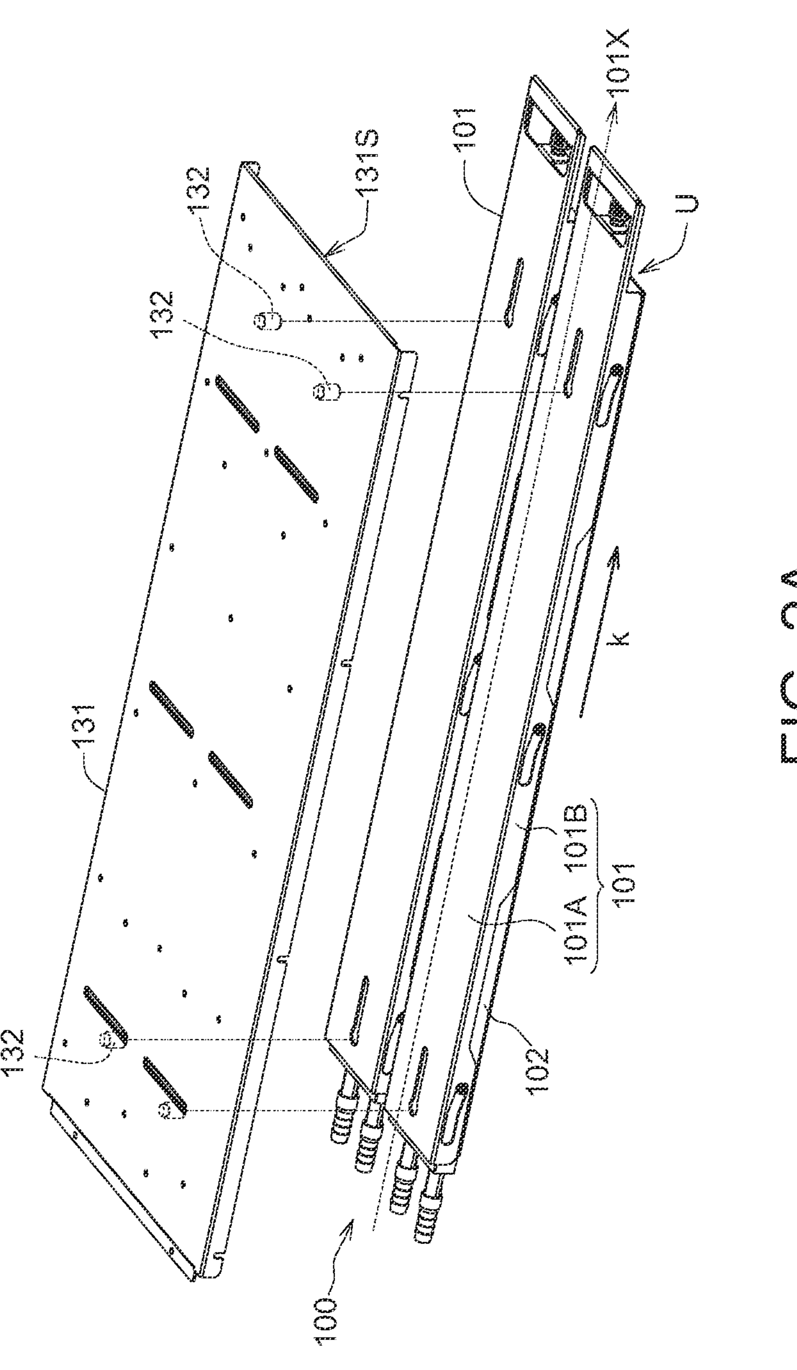
Figure 2B:
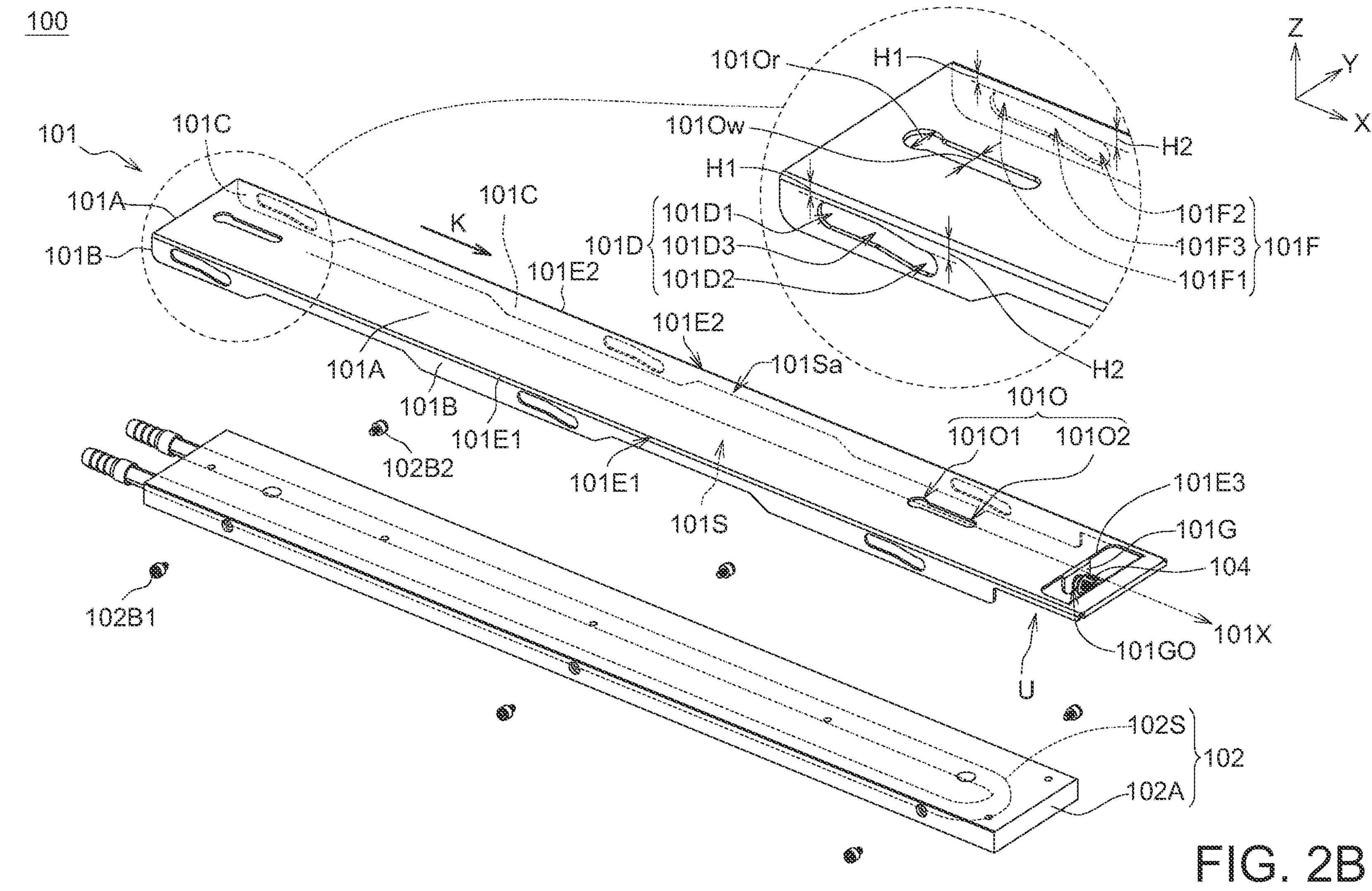
FIG. 2B is a structural perspective diagram of the assembly of the thermal exchange device of FIG. 2A.

Refer to FIG. 2A and FIG. 2B. FIG. 2A is a structural perspective diagram of the assembly of a thermal exchange device 100 according to an embodiment of the present specification. FIG. 2B is a structural perspective diagram of the assembly of the thermal exchange device 100 of FIG. 2A. The thermal exchange device 100 includes a sliding plate 101 and a thermal exchange unit 102. The sliding plate 101 is slidably fixed on the upper cover 131 of the bracket 130 and can be slidably coupled with the thermal exchange unit 102, so that the sliding plate 101 can move relative to the upper cover 131 and the thermal exchange unit 102 in a direction parallel to the long axis 101X of the plate-shaped body 101A of the sliding plate 101.

To put it in greater details, the sliding plate 101 includes a plate-shaped body 101A, a first flange 101B and a second flange 101C. The plate-shaped body 101A has a bottom surface 101S and a long axis 101X. The first flange 101B protrudes from the plate-shaped body 101A and parallel to the first side 101E1 of the long axis 101X; the second flange 101C protrudes from the second side 101E2 of the plate-shaped body 101A and parallel to the first flange 101B. The plate-shaped body 101A, the first flange 101B and the second flange 101C together define a slide groove U for receiving at least a part of the thermal exchange unit 102.

In the present embodiment, the plate-shaped body 101A is an oblong plate. The first flange 101B and the second flange 101C are respectively connected to the two long sides of the plate-shaped body 101A (the first side 101E1 and the second side 101E2) and are perpendicular to the two oblong sidewalls of the bottom surface 101S of the plate-shaped body 101A. The slide groove U is a long groove defined by the bottom surface 101S of the plate-shaped body 101A, the inner surface of the first flange 101B and the inner surface of the second flange 101C, and allows the thermal exchange unit 102 to move in the long groove and extend in a direction K parallel to the long axis 101X of the plate-shaped body 101A.

The first flange 101B has a first guide slit 101D; the second flange 101C has a second guide slit 101F. Both the first guide slit 101D and the second guide slit 101F extend in a direction K parallel to the long axis 101X of the plate-shaped body 101A. In some embodiments of the present specification, the first guide slit 101D and the second guide slit 101F respectively can be an elongated alcove recessed to the inner surface of the first flange 101B and the inner surface of the second flange 101C (not illustrated). In the present embodiment, the first guide slit 101D and the second guide slit 101F respectively are a slit passing through the first flange 101B and the second flange 101C.

The first guide slit 101D passing through the first flange 101B includes a first section 101D1, a second section 101D2 and a first guide slit 101D3 connecting the first section 101D1 and the second section 101D2. The first section 101D1 and the second section 101D2 both extend in a direction K parallel to the long axis 101X. The upper edge of the first section 101D1 and the first side 101E1 are separated by a first distance H1. The upper edge of the second section 101D2 and the first side 101E1 are separated by a second distance H2 greater than the first distance H1.

The second guide slit 101F passing through the second flange 101C includes a third section 101F1, a fourth section 101F2 and a second guide slit 101F3 connecting the third section 101F1 and the fourth section 101F2. The third section 101F1 and the fourth section 101F2 both extend in a direction K parallel to the long axis 101X. The upper edge of the third section 101F1 and the second side 101E2 are separated by a first distance H1. The upper edge of the fourth section 101F2 and the second side 101E2 are separated by a second distance H2.

It should be noted that in the present embodiment the distance between the third section 101F1 and the second side 101E2 is identical to the distance between the first section 101D1 and the first side 101E1 (both are the first distance H1), and the distance between the fourth section 101F2 and the second side 101E2 is identical to the distance between the second section 101D1 and the first side 101E1 (both are the second distance H2). However, the distance between the first guide slit 101D and the plate-shaped body 101A is not necessarily identical to the distance between the second guide slit 101F and the plate-shaped body 101A. For instance, in some implementations, the distance between the third section 101F1 and the second side 101E2 can be different from the distance between the first section 101D1 and the first side 101E1, and the distance between the fourth section 101F2 and the second side 101E2 can also be different from the distance between the second section 101D1 and the first side 101E1.

In some embodiments of the present specification, the thermal exchange unit 102, which can be realized by a liquid cooling system, includes a cold plate body 102A and a built-in circulation channel 102S. In the present embodiment, the cold plate body 102A can be realized by an oblong metal casing, in which a circulation channel 102S is windingly arranged. Through the contact between the cold plate body 102A and the power supply unit 120 received in the first accommodation space R1, the fluid flowing in the circulation channel 102S can dissipate the heat generated by the power supply unit 120 or guide the said heat to the outside of the power supply system 10.

As indicated in FIG. 2A, at least a part of the thermal exchange unit 102 is received in the slide groove U of the sliding plate 101; the thermal exchange unit 102 includes a first guide rod 102B1 and a second guide rod 102B2 respectively extending into the first guide slit 101D and the second guide slit 101F. In some embodiments of the present specification, the first guide rod 102B1 and the second guide rod 102B2 respectively can be a convex column, a guide rod or a bearing protruding from the two sides of the thermal exchange unit 102.

In the present embodiment, the first guide rod 102B1 and the second guide rod 102B2 are convex columns fixed on and protruding from the two side surfaces the thermal exchange unit 102 by way of screw locking. As the first guide rod 102B1 and the second guide rod 102B2 are respectively coupled with the first guide slit 101D and the second guide slit 101F, the thermal exchange unit 102 can be limited inside the slide groove U of the sliding plate 101, and the sliding plate 101 can horizontally move relative to the thermal exchange unit 102 in a direction parallel to the long axis 101X.

Figures 3A, 3B:
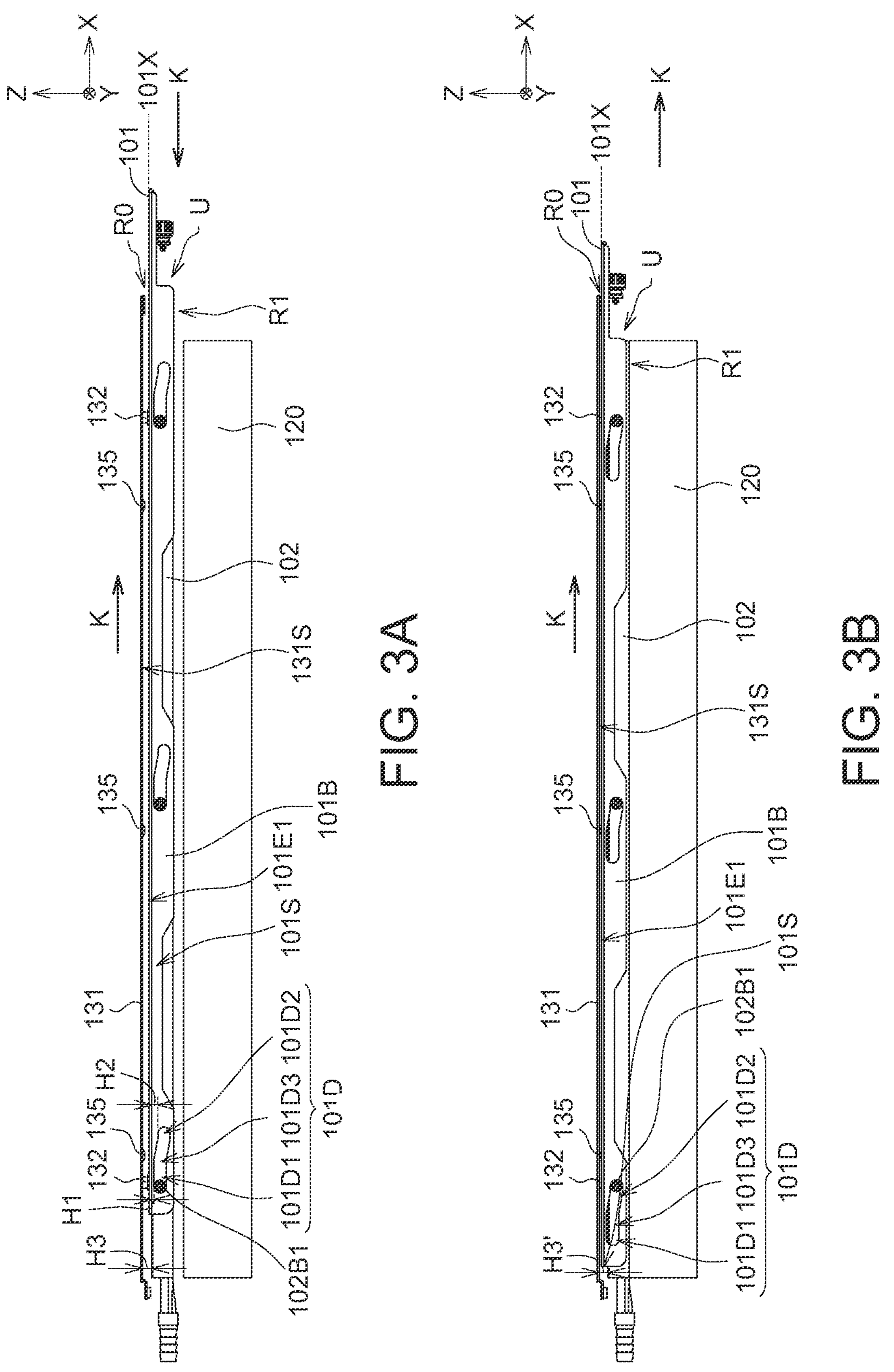
FIG. 3A and FIG. 3B respectively are actuation diagrams of partial structure of the sliding plate of FIG. 2A horizontally moving relative to the thermal exchange unit.

Refer to FIG. 3A and FIG. 3B. FIG. 3A is an actuation diagram of partial structure of the sliding plate 101 of FIG. 2A horizontally moving relative to the thermal exchange unit 102 towards the outside of the opening RO of the second accommodation space R2 in a direction K parallel to the long axis 101X. FIG. 3B is an actuation diagram of partial structure of the sliding plate 101 of FIG. 2A horizontally moving relative to the thermal exchange unit 102 towards the inside of the opening RO of the second accommodation space R2 in a direction K parallel to the long axis 101X (the structure and actuation of the second guide rod 102B2 are similar to that of the second guide slit 101F, and therefore are omitted here).

As indicated in FIG. 3A, when the sliding plate 101 horizontally moves towards the outside of the opening RO of the second accommodation space R2, the position of the first guide rod 102B1 relative to the first guide slit 101D will shift from the first section 101D1 to the second section 101D2; meanwhile the position of the second guide rod 102B2 (not illustrated in FIG. 3A) relative to the second guide slit 101F will shift from the third section 101F1 to the fourth section 101F2. Since the first section 101D1 and the second section 101D2 are separated from the bottom surface 101S of the sliding plate 101 by different distances (the first distance H1 and the second distance H2, respective), the third section 101F1 and the fourth section 101F2 are also separated from the bottom surface 101S of the sliding plate 101 by different distances, and the distance difference is the same. Therefore, when the thermal exchange unit 102 is driven by the sliding plate 101 to vertically move relative to the sliding plate 101 in a direction perpendicular to the long axis 101X, the distance between the thermal exchange unit 102 and the bottom surface 101S of the sliding plate 101 will be reduced. For instance, in the present embodiment, the reduced distance between the thermal exchange unit 102 and the bottom surface 101S of the sliding plate 101 is equivalent to the difference between the second distance H2 and the first distance H1 (the reduced distance=H2−H1). Meanwhile, the distance H3 between the thermal exchange unit 102 and the inner surface 131S of the upper cover 131 will be reduced at the same time.

As indicated in FIG. 3B, when the sliding plate 101 horizontally moves towards the inside of the opening RO of the second accommodation space R2, the position of the first guide rod 102B1 relative to the first guide slit 101D will shift from the second section 101D to the first section 101D1; meanwhile the position of the second guide rod 102B2 (not illustrated in FIG. 3B) relative to the second guide slit 101F will shift from the fourth section 101F2 to the third section 101F1. When the thermal exchange unit 102 is driven by the sliding plate 101 to vertically move relative to the sliding plate 101 in a direction perpendicular to the long axis 101X, the distance between the thermal exchange unit 102 and the bottom surface 101S of the sliding plate 101 will be increased. Meanwhile, the distance H3 between the thermal exchange unit 102 and the inner surface 131S of the upper cover 131 will be increased at the same time.

Figure 4:
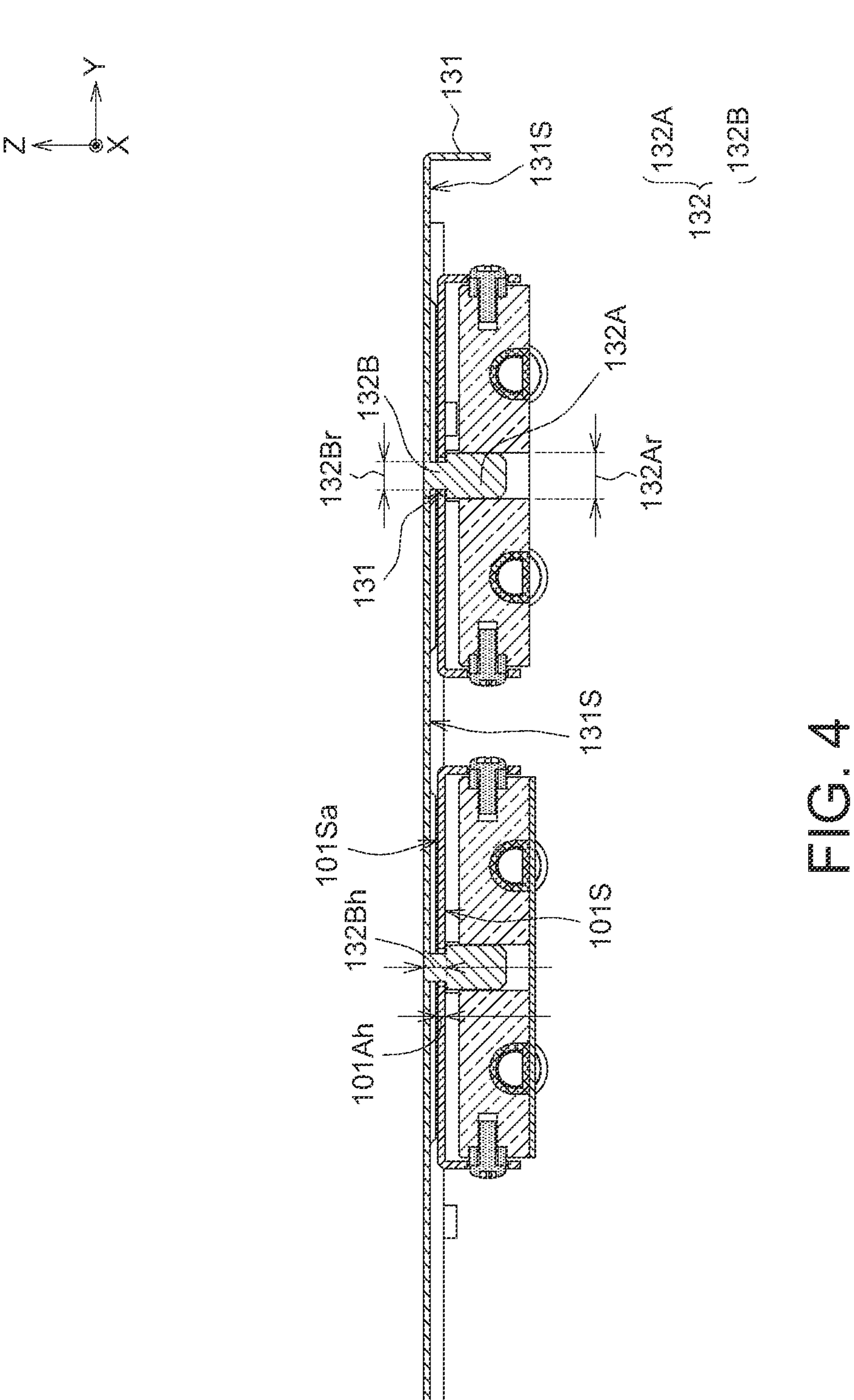
FIG. 4 is a cross-sectional view of partial structure of the power supply system along the cross-sectional line S1 of FIG. 1A and FIG. 1B.

FIG. 4 is a cross-sectional view of partial structure of the power supply system 10 along the cross-sectional line S1 of FIG. 1A and FIG. 1B. In some embodiments of the present specification, the sliding plate 101 of the thermal exchange device 100 is slidably fixed on the upper cover 13 of the bracket 130 through a limiting member 132 connected to the inner surface 131S of the upper cover 131.

As indicated in FIG. 4, the inner surface 131S of the upper cover 131 faces the side surface 101Sa (the opposite side of the bottom surface 101S of the plate-shaped body 101A of the sliding plate 101). The limiting member 132 protrudes from the inner surface 131S of the upper cover 131. The sliding plate 101 has a limiting slot 101O on the side surface 101Sa, that is, the opposite side of the bottom surface 101S. The limiting member 132 passes through the limiting slot 101O to movably engage the sliding plate 101 in the first accommodation space R1 of the bracket 130.

To put it in greater details, in the present embodiment, the limiting slot 101O is a long through groove passing through the bottom surface 101S of the plate-shaped body 101A of the sliding plate 101 and the side surface 101Sa opposite to the bottom surface 101S, wherein the long through groove includes an expansion hole 101O1 and a slender part 101O2. The slender part 101O2 is a space that extends in an X direction parallel to the long axis 101 of the sliding plate 101 and is interconnected with the expansion hole 101O1. The width 101Ow of the slender part 101O2 is less than the inside diameter 101Or of the expansion hole 101O1 (as indicated in FIG. 2B).

As indicated in FIG. 4, the limiting member 132 includes an expansion portion 132A and a rod 132B. The inner diameter 132Ar of the expansion portion 132A (the first radial size) is substantially equivalent to or slightly less than the inside diameter 101Or of the expansion hole 101O1. The rod 132B is connected between the expansion portion 132A and the inner surface 131S of the upper cover 131. The diameter 132Br of the rod 132B (the second radial size) is substantially equivalent to or slightly less than the width 101Ow of the slender part 101O2, and the length 132Bh of the rod 132B (the axial length) is substantially equivalent to or slightly greater than the thickness 101Ah of the plate-shaped body 101A.

For the thermal exchange device 100 to be received in the second accommodation space R2 of the bracket 130, firstly the expansion portion 132A of the limiting member 132 must pass through the expansion hole 101O1 of the limiting slot 101O, so that the expansion portion 132A of the limiting member 132 can be completely located on one side of the bottom surface 101S of the plate-shaped body 101A. When the sliding plate 101 horizontally moves relative to the thermal exchange unit 102 in a direction parallel to the long axis 101X, the rod 132B of the limiting member 132 can slidably pass through the slender part 101O2 of the limiting slot 101O, so that the plate-shaped body 101A of the sliding plate 101 can be slidably fixed on the upper cover 131 of the bracket 130. Meanwhile, the thermal exchange unit 102 is fixed on the plate-shaped body 101A of the sliding plate 101 by extending into the first guide rod 102B1 of the first guide slit 101D and the second guide rod 102B2 of the second guide slit 101F. When the sliding plate 101 horizontally moves relative to the thermal exchange unit 102 in a direction parallel to the long axis 101X, the trajectory and amplitude of the movement of the sliding plate 101 will be limited by the limiting slot 101O and only a part of the plate-shaped body 101A is allowed to be extended outside the second accommodation space R2.

In some embodiments of the present specification, the bracket 130 further includes a stop strip 134 located outside the opening RO of the second accommodation space R2 in a direction parallel to the inner surface 131S of the upper cover 131. For the thermal exchange device 100 to be received in the second accommodation space R2 of the bracket 130, at least a locking element (such as screws) 136 can detachably fix the stop strip 134 on the bracket 130 to prevent the thermal exchange unit 120 from sliding off the second accommodation space R2. Meanwhile, a gap G is formed between the stop strip 134 and the inner surface 131S of the upper cover 131, so that when the sliding plate 101 horizontally moves relative to the thermal exchange unit 102 in a direction parallel to the long axis 101X, a part of the plate-shaped body 101A can be extended outside the second accommodation space R2 (as indicated in FIG. 1A).

In some embodiments of the present specification, the bracket 130 further includes at least one buffer (such as a rubber strip or a plastic member) 135 protruding from the inner surface 131S of the upper cover 131. When the plate-shaped body 101A of the sliding plate 101 is slidably fixed on the upper cover 131 of the bracket 130, the buffer 130 can lean on the side surface 101Sa (the opposite side of the bottom surface 101S of the plate-shaped body 101A of the sliding plate 101) (as indicated in FIG. 3A and FIG. 3B) to buffer the squeezing force generated when the plate-shaped body 101A and the upper cover 131 are coupled.

Refer to FIG. 1B and FIG. 3A again. When the plate-shaped body 101A of the sliding plate 101 is pulled towards the outside of the opening RO of the second accommodation space R, the first guide rod 102B1 and the second guide rod 102B2 of the thermal exchange unit 102 respectively shift to the first section 101D1 of the first guide slit 101D and the third section 101F1 of the second guide slit 101F. Meanwhile, the cold plate body 102A of the thermal exchange unit 102 will be dragged towards the plate-shaped body 101A of the sliding plate 101 by the first guide slit 101D and the second guide slit 101F through the first guide rod 102B1 and the second guide rod 102B2, so that the distance H3 between the cold plate body 102A and the inner surface 131S of the upper cover 131 can be reduced. Therefore, more space can be obtained in the cavity R, and the power supply unit 120 can be more easily plugged into or unplugged from the first accommodation space R1.

Conversely, when the plate-shaped body 101A of the sliding plate 101 is pushed towards the inside of the second accommodation space R2, the first guide rod 102B1 and the second guide rod 102B2 of the thermal exchange unit 102 respectively shift to the second section 101D2 of the first guide slit 101D and the fourth section 101F2 of the second guide slit 101F. Meanwhile, the cold plate body 102A of the thermal exchange unit 102 will be dragged to move farther away from the plate-shaped body 101A of the sliding plate 101 by the first guide slit 101D and the second guide slit 101F through the first guide rod 102B1 and the second guide rod 102B2, so that the distance H3' between the cold plate body 102A and the inner surface 131S of the upper cover 131 can be increased. Therefore, the heat transfer efficiency of the thermal exchange unit 102 can be increased by pushing the cold plate body 102A of the thermal exchange unit 102 to tightly contact the power supply unit 120 (as indicated in FIG. 1A and FIG. 3B).

In some embodiments of the present specification, the sliding plate 101 further includes a third flange 101G, protruding from a third side 101E3 of the bottom surface 101S perpendicular to the long axis 101X and located outside the opening RO of the second accommodation space R2. The third flange 101G has a fixing hole 101GO. When the sliding plate 101 is pushed towards the inside of the opening RO of the second accommodation space R2, the first guide rod 102B1 and the second guide rod 102B2 respectively slide to the second section 101D2 of the first guide slit 101D and the fourth section 101F2 of the second guide slit 101F. Meanwhile, a fixing member 104 (such as screw) can pass through the fixing hole 101GO, so as to fix the plate-shaped body 101A of the sliding plate 101 on the stop strip 134.

According to the above embodiments, a thermal exchange device 100 and a power supply system 10 applying the same are provided. The thermal exchange device 100 includes a thermal exchange unit 102 and a sliding plate 101 arranged on the thermal exchange unit 102. The thermal exchange unit 102 and the sliding plate 101 can be slidably coupled together through the guide member protruding from of the thermal exchange unit 102 (such as the first guide member 102B1 and the second guide member 102B2) and the guide slit arranged in the sliding plate 101 (such as the first guide slit 101D and the second guide slit 101F). Then, the sliding plate 101 can be slidably fixed on the inner side of the upper cover 131 of the bracket 130. The guide slits 101D and 101F parallel to the long axis 101X of the sliding plate 101 can guide the sliding plate to horizontally move relative to the thermal exchange unit 102 in a direction K parallel to the long axis 101X. Through the design of differential vertical distance between different sections (such as the first section 101D1 and the second section 101D2) of the guide slit (such as the first guide slit 101D) and the plate-shaped body 101A of the sliding plate 101 (the distance difference=H2−H1), the guide member (such as the first guide member 102B1) is dragged, so that the thermal exchange unit 102 can vertically move in a direction perpendicular to the long axis 101X of the sliding plate 101 to adjust the distance H3 (or H3') between the thermal exchange unit 102 and the inner side of the upper cover 131 of the bracket 130.

When the thermal exchange device 100 and the thermal source body (such as the power supply unit 120) are both received in the accommodation cavity R of the power supply system 10, the horizontal/vertical movement of the sliding plate 101 enables the thermal exchange unit 102 to tightly contact the thermal source body (such as the power supply unit 120), so that the efficiency of heat dissipation can be increased. Or, the thermal exchange unit 102 and the thermal source body (such as the power supply unit 120) are separated from each other, so that the thermal source body (such as the power supply unit 120) can be more easily detached or assembled in the accommodation cavity R through simple plugging/unplugging actions.

While the invention has been described by way of example and in terms of the preferred embodiment(s), it is to be understood that the invention is not limited thereto. Based on the technical features embodiments of the present invention, a person ordinarily skilled in the art will be able to make various modifications and similar arrangements and procedures without breaching the spirit and scope of protection of the invention. Therefore, the scope of protection of the present invention should be accorded with what is defined in the appended claims.

What is claimed is:

1. A thermal exchange device, comprising:

a sliding plate, comprising:
- a plate-shaped body, having a long axis;
- a first flange protruding from a first side of the plate-shaped body, wherein the first side is parallel to the long axis, and the first flange has a first guide slit, comprising:
  - a first section, extending in a direction parallel to the long axis and separated from the first side by a first distance;
  - a second section, extending in a direction parallel to the direction and separated from the first side by a second distance greater than the first distance; and
  - a first guide slit, connecting the first section and the second section; and
- a second flange protruding from a second side of the plate-shaped body and parallel to the first flange, wherein the second flange defines a slide groove with the first flange and the plate-shaped body;
- a thermal exchange unit, at least partly received in the slide groove and comprising a first guide rod, extending into the first guide slit to limit the movement of the sliding plate relative to the thermal exchange unit in a direction parallel and/or perpendicular to the said direction;
- a bracket, comprising;
  - a first accommodation space, allowing a thermal source body to be detachably received therein; and
  - a second accommodation space interconnected with the first accommodation space and used to allow the thermal exchange unit and a part of the sliding plate to be detachably received therein and allow the part of the sliding plate to be received in the first accommodation space and move relative to the thermal exchange unit in a direction parallel and/or perpendicular to the said direction, so that the thermal exchange unit can contact the thermal source body or move farther away from the thermal source body.

2. The thermal exchange device according to claim 1, wherein the second flange has a second guide slit parallel to the first guide slit to receive a second guide rod protruding from the thermal exchange unit; the second guide slit comprises:
- a third section, extending in a direction parallel to the direction and separated from the second side by the first distance;
- a fourth section, extending in a direction parallel to the direction and separated from the second side by the second distance; and
- a second guide slit, connecting the third section and the fourth section.

3. The thermal exchange device according to claim 2, wherein the first guide slit is a slit passing through the first flange, and the second guide slit is a slit passing through the second flange.

4. The thermal exchange device according to claim 1, wherein the bracket comprises:
- an upper cover, having an inner surface, wherein the upper cover is arranged opposite to the plate-shaped body and used to define a top of the first accommodation space; and
- a limiting member, protruding from the inner surface, wherein the limiting member passes through a limiting slot of the plate-shaped body to movably engage the sliding plate in the first accommodation space.

5. The thermal exchange device according to claim 4, wherein the limiting slot comprises:

an expansion hole, passing through the plate-shaped body; and a slender part, extending in a direction parallel to the direction and interconnected with the expansion hole; and wherein the limiting member comprises:

an expansion portion, having a first radial size substantially equivalent to or slightly less than an inner diameter of the expansion hole, wherein the expansion portion is used to pass through the expansion hole to be slidably engaged on a bottom surface of the plate-shaped body; and a rod, connecting the expansion portion and the inner surface, wherein the rod has a second radial size substantially equivalent to or slightly less than a width of the slender part and an axial length greater than or equivalent to a thickness of the plate-shaped body; the rod is used to slidably pass through the slender part; the first radial size is greater than the second radial size.

6. The thermal exchange device according to claim 1, wherein the bracket further comprises a stop strip detachably arranged outside an opening of the first accommodation space and used to prevent the thermal exchange unit from sliding off the first accommodation space.

7. The thermal exchange device according to claim 6, wherein the sliding plate comprises a third flange protruding from a third side of the plate-shaped body; the third side is perpendicular to the long axis and has a fixing hole; when the first guide rod is located in the second section, the third flange leans on the stop strip, and the sliding plate is fixed on the stop strip by a fixing member passing through the fixing hole.

8. The thermal exchange device according to claim 1, wherein the upper cover further comprises at least one buffer protruding from the inner surface to lean on the plate-shaped body.

9. The thermal exchange device according to claim 1, wherein the first guide rod is a convex column, a guide rod or a bearing.

10. A power supply system, comprising:

a sliding plate, comprising:

a plate-shaped body, having a long axis;

a first flange protruding from a first side of the plate-shaped body, wherein the first side is parallel to the long axis, and the first flange has a first guide slit, comprising:

a first section, extending in a direction parallel to the long axis and separated from the first side by a first distance;

a second section, extending in a direction parallel to the direction and separated from the first side by a second distance greater than the first distance; and a first guide slit, connecting the first section and the second section; and a second flange protruding from a second side of the plate-shaped body and parallel to the first flange, wherein the second flange defines a slide groove with the first flange and the plate-shaped body;

a thermal exchange unit, at least partly received in the slide groove and comprising a first guide rod, extending into the first guide slit to limit the movement of the sliding plate relative to the thermal exchange unit in the slide groove;

a power supply unit; and a bracket, comprising;

a first accommodation space allowing the power supply unit to be detachably received therein; and a second accommodation space interconnected with the first accommodation space and used to allow the thermal exchange unit and a part of the sliding plate to be detachably received therein and allow the sliding plate to move relative to the thermal exchange unit in a direction parallel and/or perpendicular to the direction, so that the thermal exchange unit can contact the power supply unit or move farther away from the power supply unit.

* * * * *